United States Patent
Sander et al.

(10) Patent No.: US 11,538,855 B2
(45) Date of Patent: Dec. 27, 2022

(54) SOI SEMICONDUCTOR STRUCTURE AND METHOD FOR MANUFACTURING AN SOI SEMICONDUCTOR STRUCTURE

(71) Applicant: TDK-Micronas GmbH, Freiburg (DE)

(72) Inventors: Christian Sander, Freiburg (DE); Martin Cornils, Freiburg (DE)

(73) Assignee: TDK-Micronas GmbH, Freiburg (DE)

( * ) Notice: Subject to any disclaimer, the term of this patent is extended or adjusted under 35 U.S.C. 154(b) by 29 days.

(21) Appl. No.: 17/395,536

(22) Filed: Aug. 6, 2021

(65) Prior Publication Data

US 2021/0366984 A1   Nov. 25, 2021

Related U.S. Application Data

(62) Division of application No. 16/691,082, filed on Nov. 21, 2019, now Pat. No. 11,114,501.

(30) Foreign Application Priority Data

Nov. 21, 2018  (DE) .................... 10 2018 009 110.5

(51) Int. Cl.
*H01L 43/14* (2006.01)
*H01L 27/22* (2006.01)
(Continued)

(52) U.S. Cl.
CPC ........ *H01L 27/22* (2013.01); *H01L 21/76251* (2013.01); *H01L 27/1203* (2013.01);
(Continued)

(58) Field of Classification Search
CPC .... G01R 33/07–077; H01L 43/06–065; H01L 43/14
See application file for complete search history.

(56) References Cited

U.S. PATENT DOCUMENTS 7,138,697 B2   11/2006   Chu et al.
9,494,661 B2   11/2016   Paul et al.
(Continued)

FOREIGN PATENT DOCUMENTS

DE   60 2005 001 401 T2   2/2008
DE   10 2009 027 338 A1   1/2011
(Continued)

*Primary Examiner* — Daniel P Shook
(74) *Attorney, Agent, or Firm* — Muncy, Geissler, Olds & Lowe, P.C.

(57) ABSTRACT

An SOI semiconductor structure, including a substrate layer formed on a back side and a semiconductor layer of a second conductivity type formed on a front side, an insulating layer being disposed between the substrate layer and the semiconductor layer, a three-dimensional Hall sensor structure having a sensor region made up of a monolithic semiconductor body being formed in the semiconductor layer, and the semiconductor body extending from an underside up to the front side, at least three first metallic terminal contacts being formed on the upper side, and at least three second metallic terminal contacts being formed on the underside, the first terminal contacts being offset with respect to the second terminal contacts in a projection perpendicular to the front side, each first terminal contact and each second terminal contact being formed in each case on a highly doped semiconductor contact region of a second conductivity type.

12 Claims, 3 Drawing Sheets

(51) Int. Cl.
*H01L 21/762* (2006.01)
*H01L 27/12* (2006.01)
*H01L 43/04* (2006.01)
*H01L 43/06* (2006.01)

(52) U.S. Cl.
CPC ............ *H01L 43/04* (2013.01); *H01L 43/065* (2013.01); *H01L 43/14* (2013.01)

(56) References Cited

U.S. PATENT DOCUMENTS

2012/0169329 A1   7/2012  Hellwig et al.
2017/0345997 A1*  11/2017 Ausserlechner ........ H01L 43/04

FOREIGN PATENT DOCUMENTS

DE    10 2016 109 883 B4   5/2018
EP         2 806 283 B1    3/2017

\* cited by examiner

SOI SEMICONDUCTOR STRUCTURE AND METHOD FOR MANUFACTURING AN SOI SEMICONDUCTOR STRUCTURE

This nonprovisional application is a Divisional of U.S. application Ser. No. 16/691,082, which was filed on Nov. 21, 2019, which claims priority under 35 U.S.C. § 119(a) to German Patent Application No. 10 2018 009 110.5, which was filed in Germany on Nov. 21, 2018, and which is herein incorporated by reference.

BACKGROUND OF THE INVENTION

Field of the Invention

The present invention relates to an SOI semiconductor structure and a method for manufacturing an SOI semiconductor structure.

Description of the Background Art

A semiconductor body is known from EP 2 806 283 B1, which corresponds to U.S. Pat. No. 9,494,661, which is incorporated herein by reference, and which has a sensor region, a three-dimensional Hall sensor arrangement being form in the sensor region. Another 3D Hall sensor is known from DE 10 2016 109 883 B4, which corresponds to US 2017/0345997. Other Hall sensor elements are known from US 2012/0169329 A1 and DE 10 2009 027 338 A1, which corresponds to U.S. Pat. No. 9,063,187. A CMOS-compatible photodetector is known from DE 60 2005 001 401 T2, which corresponds to U.S. Pat. No. 7,138,697.

SUMMARY OF THE INVENTION

It is therefore an object of the present invention to provide a device which refines the prior art.

In an exemplary embodiment of the invention, an SOI semiconductor structure is provided, which includes a second semiconductor wafer formed on a back side as a substrate layer and a semiconductor layer of a second conductivity type formed on a front side of a first semiconductor wafer.

An insulating layer is disposed between the substrate layer and the semiconductor layer.

A three-dimensional Hall sensor structure having a sensor region made up of a monolithic semiconductor body and having an integrated circuit is formed in the semiconductor layer.

The semiconductor body extends from a buried lower surface to the front side, at least three first metallic terminal contacts, spaced a distance apart, being formed on the front side, and at least three second metallic terminal contacts, spaced a distance apart, being formed on the lower surface.

At least the portion of the first terminal contacts formed on the highly doped connecting regions is disposed in a projection perpendicular to the front side, offset at least from the portion of the second terminal contacts formed on the highly doped connecting regions.

Each first terminal contact and each second terminal contact can be formed in each case at least partially on a first or second highly doped semiconductor contact region of a second conductivity type.

The first terminal contacts and the second terminal contacts each can have a multiple, in particular ternary, rotational symmetry with respect to an axis of symmetry viewed perpendicularly on the front side and on the lower surface of the semiconductor body.

The first terminal contacts can be disposed offset from the second terminal contacts since the associated first highly doped semiconductor contact regions are disposed offset from the associated second highly doped semiconductor contact regions.

The underside of the semiconductor body can be formed on the insulating layer.

The term SOI semiconductor structure can refer to a structure which is manufactured by a semiconductor bonding process. A first semiconductor wafer is "bonded" to a second semiconductor wafer by means of an oxide layer. The two semiconductor wafers are preferably made from an identical semiconductor material, in particular from silicon, to avoid resulting in a warping in the case of a temperature change, due to different coefficients of expansion.

The expression "three-dimensional Hall sensor structure" can be a Hall sensor which has a cohesive extension within the semiconductor body in all three spatial directions, and all three components of a magnetic field may be determined with the aid of the Hall sensor structure.

The highly doped semiconductor contact regions can be formed, for example, by means of an implantation step, the dose being above $10e15$ $N/cm^3$.

The insulating intermediate layer can be completely or overwhelmingly made up of silicon dioxide.

An advantage of the device is that, with the aid of the SOI semiconductor structure, a 3-dimensional Hall sensor spatially formed in the three spatial directions in the semiconductor layer may be formed together with an integrated circuit. In particular, the integrated circuit is in an electrical operative connection with the Hall sensor structure. Highly sensitive Hall sensors may be cost-effectively and reliably manufactured hereby.

The semiconductor body can be electrically insulated from the remaining semiconductor structure with the aid of a circumferential trench structure. It is understood that the trench structure, which is also referred to as a trench, is situated at a distance from the first terminal contacts and the second terminal contacts. It is also understood that the semiconductor body and the sensor structure are electrically insulated from the rest of the semiconductor layer, while the first terminal contacts and the second terminal contacts are preferably connected to the integrated circuit with the aid of printed conductors.

The depth of the trench structure can extend up to the insulating intermediate layer. Alternatively, the intermediate layer also comprises multiple insulating intermediate layers, for example a combination of $SiO_2$ and $Si3N4$ layers. The trench structure preferably has a $SiO_2$ layer running around the entire area on the side walls. A doped polysilicon is preferably formed between the side walls, the polysilicon being advantageously connected to a reference potential.

The semiconductor body or the sensor region can be provided with, for example, a hexagonal design. Also, the semiconductor body can have a different shape, e.g. a square shape or the shape of a polygon.

The semiconductor body can have a thickness between 2 µm and 30 µm in the sensor region. At most, the semiconductor body preferably has a thickness of up to 100 µm in the sensor region. The thickness of the semiconductor body can be constant at least within the sensor region. In particular, the surface on the front side of the semiconductor body is almost completely or completely parallel and flat with respect to the surface on the underside at least in the area of the sensor region. It should be noted that almost completely is understood to be a value above 90%.

A ratio between the thickness and length of the semiconductor body in the sensor region can be in a range between 0.6 to 1.4 or in a range between 0.8 to 1.2. The sensor region is preferably isotropic, i.e. the ratio between thickness and length is 1.0. Studies have shown that all three components of a magnetic field may be easily determined hereby. In particular, the three components may be determined simultaneously.

The second terminal contacts can each comprise a highly doped polysilicon of a second conductivity type.

The second terminal contacts can be electrically connected from the front side, and/or the second terminal contacts can be electrically connected from the back side.

It is understood that, in each case, one of the first terminal contacts forms a contact pair with one of the second terminal contacts during the measurements, i.e. either a current is provided or a voltage is tapped at the two terminals of the contact pair.

The semiconductor layer can have a lower thickness outside the sensor region than within the sensor region, the thickness of the semiconductor layer outside the sensor region being in a range between 0.1 µm and 10 µm or in a range between 0.5 µm and 2 µm.

An integrated circuit can be formed in the semiconductor layer outside the sensor region, the integrated circuit being in an electrical operative connection with the Hall sensor structure. In particular, a low substrate thickness is advantageous for a formation of an integrated circuit with the aid of CMOS transistors in order to reduce the parasitic capacitances.

The semiconductor layer can have a region or regions of a first conductivity type outside the sensor region. This is desirable, in particular in the area of the integrated circuit.

The first conductivity type is a p type, and the second conductivity type is an n type or vice versa.

A method for manufacturing an SOI semiconductor structure is also provided, which has a three-dimensional Hall sensor structure.

In a first process stage, a plurality of process steps are carried out on a first semiconductor wafer, which includes a semiconductor layer of a second conductivity type having a first front surface and a first back surface.

With the aid of the plurality of process steps, at least three second highly doped semiconductor contact regions of the second conductivity type, which are assigned to each of the second terminal contacts, are manufactured on the first front surface by means of implantation.

In a second process stage, the first front surface of the first semiconductor wafer is joined to a second front surface of a second semiconductor wafer designed as a substrate wafer.

After the joining, an insulating layer is formed between the first semiconductor wafer and the second semiconductor wafer.

Due to the joining, the first back surface of the first semiconductor wafer becomes a front side of the SOI semiconductor wafer, and the second back surface of the second semiconductor wafer becomes the back side of the SOI semiconductor wafer.

The first front surface of the first semiconductor wafer becomes a buried bottom surface above the insulating layer after the joining.

In a third process stage, the front side of the SOI semiconductor wafer, and thereby the semiconductor layer, is made thinner.

Moreover, in the third process stage, first highly doped semiconductor contact regions are created on the thinned front side of the SOI semiconductor wafer by means of implantation, and first terminal contacts are formed on each of the first semiconductor contact regions.

A trench structure completely surrounding the sensor region can be formed on the front side in a fourth process stage. It is understood that the semiconductor body and the sensor structure are electrically insulated from the rest of the semiconductor layer, while the first terminal contacts and the second terminal contacts are preferably connected to the integrated circuit with the aid of printed conductors.

Contact regions can be deposited and structured as doped polysilicon during the first process stage for connecting the highly doped semiconductor contact regions of the second conductivity type.

The structured polysilicon can be covered with the aid of a dielectric during the first process stage. The dielectric preferably comprises a silicon dioxide and/or a silicon nitride.

An oxide can be formed as an insulating layer in the second process stage.

The semiconductor layer can be formed in two different thicknesses in the third process stage, the area of the sensor region having a greater thickness than that of the area surrounding the sensor region. A mask process and a CMP process are preferably carried out for this purpose. Alternatively, the thickness of the semiconductor layer is the same over the entire extension.

In the third process stage, the semiconductor layer having a thickness between 2 µm and 30 µm can be formed in the area of the sensor region by means of a CMP process. At most, the semiconductor body can have, for example, a thickness of up to 100 µm in the sensor region.

The trench etching outside the sensor region can be carried out in the third process stage.

The second buried terminal contacts can be connected from the front side of the semiconductor layer in the third process stage and in the fourth process stage.

The second terminal contacts can be connected from the back side of the carrier substrate in the third process stage and/or in the fourth process stage.

The first terminal contacts and the second terminal contacts can be electrically connected in a fifth process stage.

Further scope of applicability of the present invention will become apparent from the detailed description given hereinafter. However, it should be understood that the detailed description and specific examples, while indicating preferred embodiments of the invention, are given by way of illustration only, since various changes, combinations, and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1:
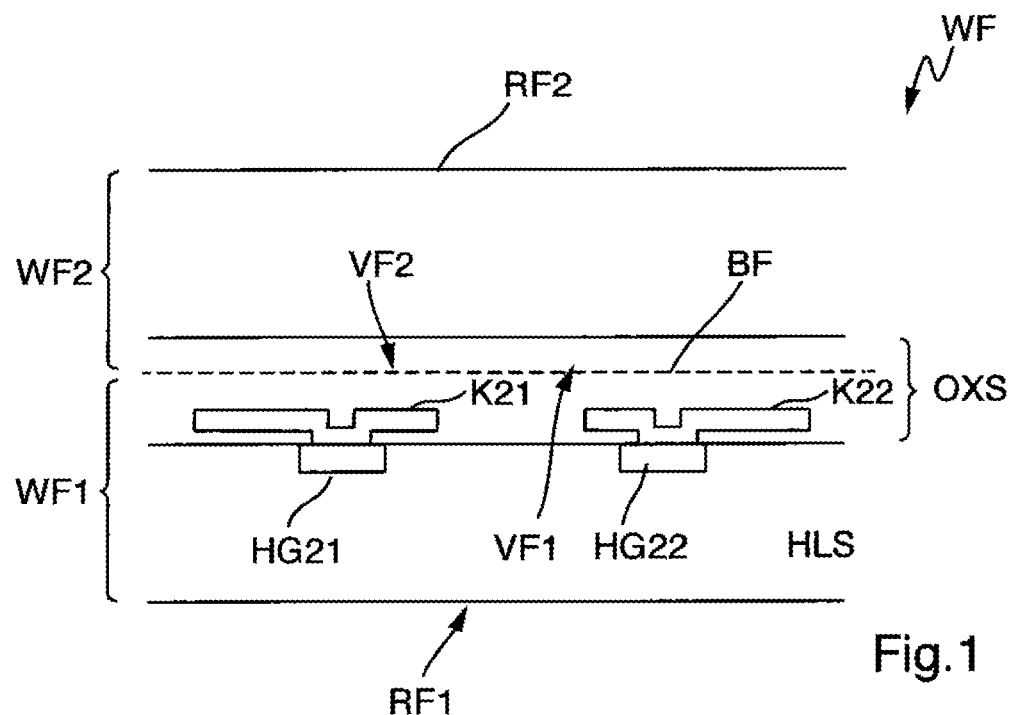
FIG. 1 shows a cross-sectional view of a semi-finished product for manufacturing an SOI semiconductor structure.

The illustration in FIG. 1 shows a cross-sectional view of an SOI semiconductor structure WF. SOI semiconductor structure WF comprises a first semiconductor wafer WF1, joined or bonded to a second semiconductor wafer WF2. An insulating layer OXS made from a silicon dioxide is formed between the two semiconductor wafers WF1 and WF2 by the bonding of the two semiconductor wafers WF1 and WF2. Semiconductor wafers WF1 and WF2 are preferably designed as silicon wafers.

First semiconductor wafer WF1 includes a semiconductor layer HLS of a second conductivity type, which has a first front surface VF1 and a first back surface RF1.

Second semiconductor wafer WF2, which has a second front surface VF2 and a second back surface RF2, comprises a substrate layer. The substrate layer is designed as a carrier layer.

The two front surfaces VF1 and VF2 of the two semiconductor wafers WF1 and WF2, each preferably covered with a silicon dioxide, are joined in an integral and force-fitting manner along a joining surface BF, also referred to as a bond surface. Joining surface BF runs within insulating layer OXS, the insulating layer being essentially made up of silicon dioxide, i.e. by more than 50%.

Before the joining process, first front surface VF1 forms a surface of first semiconductor wafer WF1, three highly doped second semiconductor contact regions HG21, HG22 and HG23 of a second conductivity type being preferably created by means of implantation on the surface of first semiconductor wafer WF1 in a plurality of process steps before the joining process.

A second terminal contact K21, K22 and K23 is subsequently formed on each of second semiconductor contact regions HG21, HG22 and HG23. Second terminal contacts K21, K22 and K23 are preferably formed from doped polysilicon or metal.

It should be noted that second semiconductor contact region HG23 and second terminal contact K23 are only illustrated in a subsequent top view for reasons of clarity.

Figure 2:
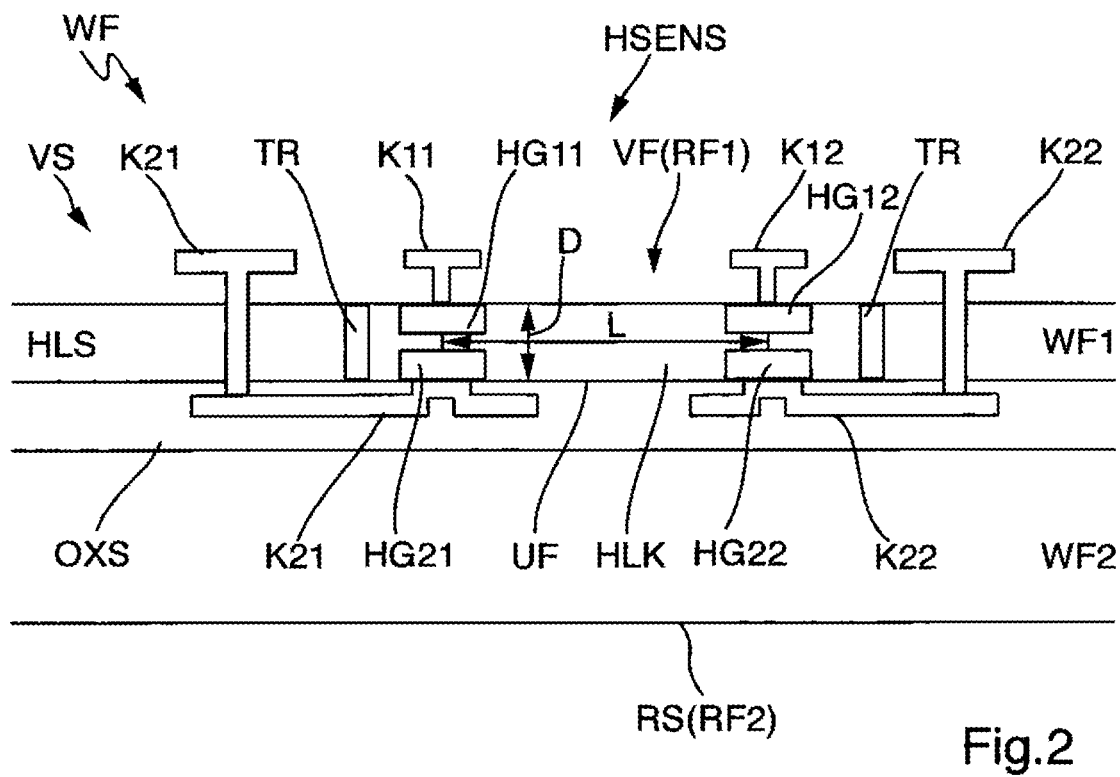
FIG. 2 shows a cross-sectional view of a first specific embodiment of an SOI semiconductor structure, including a sensor region.

The illustration in FIG. 2 shows a cross-sectional view of a first specific embodiment of an SOI semiconductor structure having a sensor region. Only the differences from the illustration in FIG. 1 are explained below.

Due to the joining, first back surface RF1 of first semiconductor wafer WF1 becomes a front side VS of semiconductor layer HLS, semiconductor layer HLS of first semiconductor wafer WFI being thinned from a thickness D of several hundred μm to a thickness D in the range between 2 μm and 30 μm, preferably by means of a CMP process.

Second back surface RF2 of second semiconductor wafer WF2 becomes back side RS of SOI semiconductor structure WF.

The semiconductor surface of first front surface VF1 of first semiconductor wafer WF1 becomes a buried lower surface above insulating layer OXS after the joining.

After the joining, highly doped first semiconductor contact regions HG11, HG12, HG13 are created in subsequent process steps by means of implantation, and first terminal contacts K11, K12, K13 are subsequently formed on each of first semiconductor contact regions HG11, HG12, HG13.

To form a sensor region for forming a three-dimensional Hall sensor structure HSENS, a semiconductor body HLK is electrically insulated from remaining semiconductor layer HLS with the aid of a circumferential trench structure TR, the ratio of thickness D of semiconductor layer HLS or semiconductor body HLK to a length L of semiconductor body HLK comprising a range between 0.6 and 1.4 or a range between 0.8 and 1.2 in the sensor region. The ratio is preferably 1. The lateral extension of the sensor region results from length L of semiconductor body HLK between two first terminal contacts K11, K12 and K13.

Second terminal contacts K21, K22 and K23 are electrically connected from front side VS in additional process steps.

Semiconductor layer HLS outside the sensor region, i.e. remaining semiconductor layer HLS, has the same thickness D as within the sensor region. An integrated circuit—not illustrated—is formed in an area of remaining semiconductor layer HLS. The integrated circuit is electrically connected to terminal contacts K11, K12, K13, K21, K22 and K23 with the aid of printed conductors—not illustrated.

One advantage is that an easy and cost-effective manufacturing results with the aid of a monolithic design of the integrated circuit and Hall sensor structure HSENS in semiconductor layer HLS.

Figure 3:
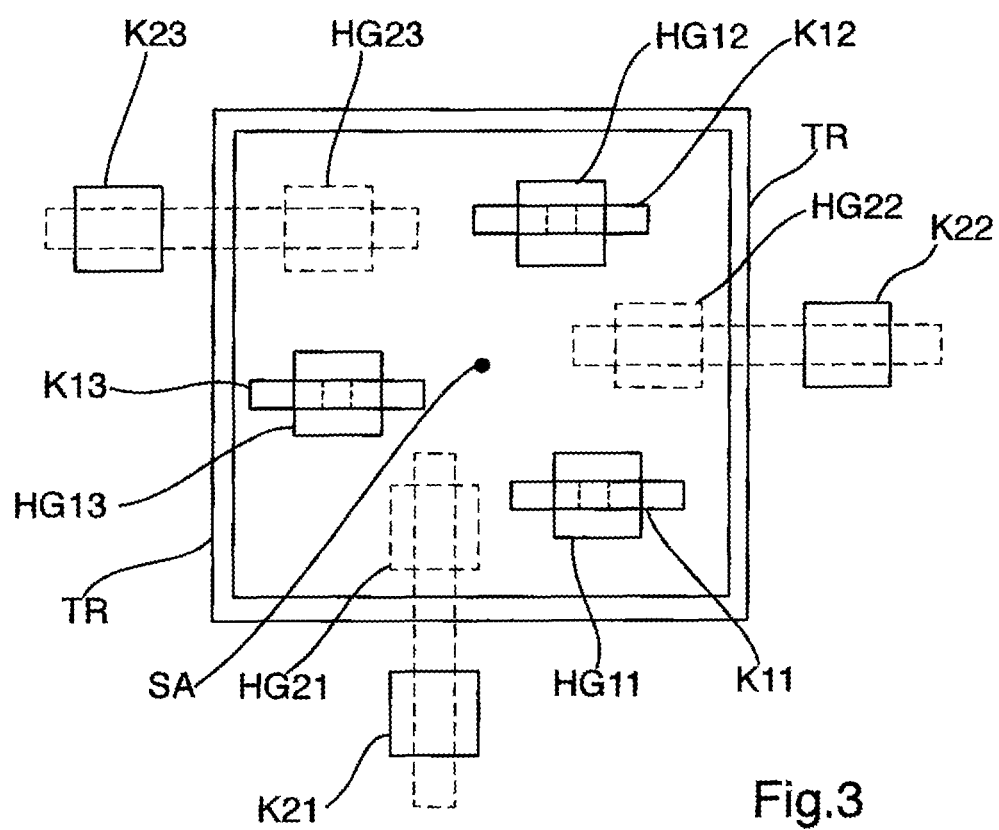
FIG. 3 shows a top view of an upper side of the sensor region illustrated in FIG. 2.

The illustration in FIG. 3 shows a top view of a front side VS of the sensor region illustrated in FIG. 2. Only the differences from the illustration in FIG. 2 are explained below.

Semiconductor body HLK, and thus the sensor region, is designed to be electrically insulated from the other regions of semiconductor layer HLS with the aid of trench structure TR, which is provided with a square design for reasons of clarity. Semiconductor body HLK is preferably provided with a hexagonal design or is designed in the shape of a polygon.

Second semiconductor contact regions HG21, HG22 and HG23—drawn with a dashed line—have a multiple, in particular a ternary, symmetry with regard to an axis of symmetry SA.

First semiconductor contact regions HG11, HG12 and HG13, formed on front side VS, also have a multiple, in particular a ternary, symmetry with regard to axis of symmetry SA.

First semiconductor contact regions HG11, HG12 and HG13 on front side VS are disposed, offset with respect to second semiconductor contact regions HG21, HG22 and HG23, on burred lower surface OS.

Figure 4:
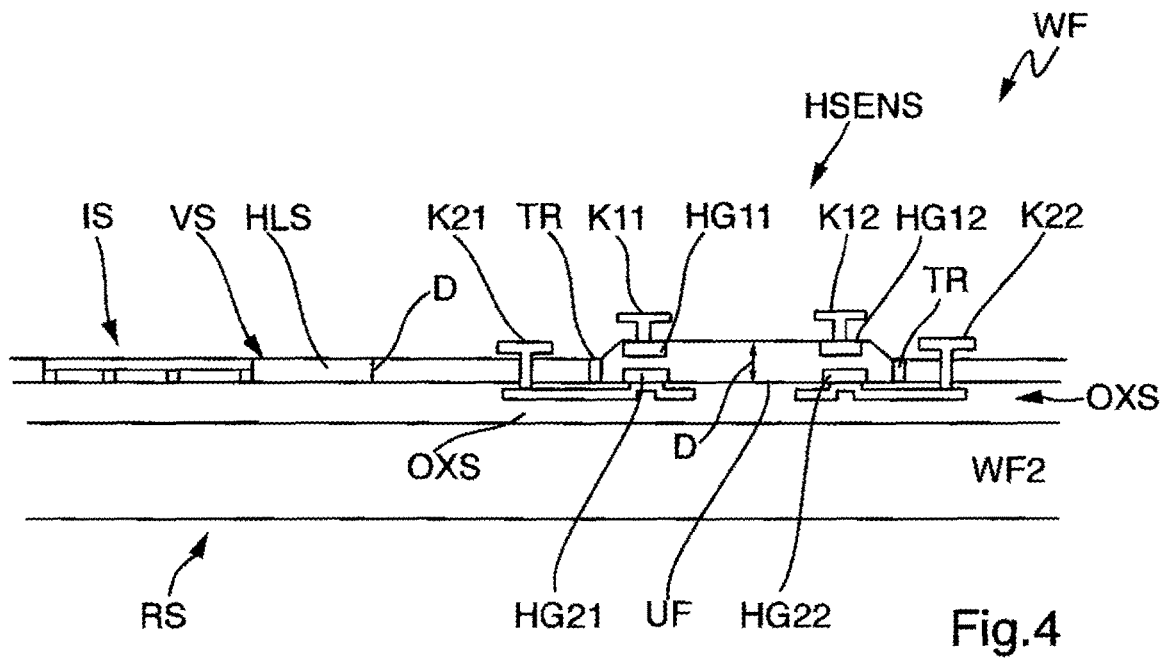
FIG. 4 shows a cross-sectional view of the SOI semiconductor structure with two different thicknesses of a semiconductor region.

The illustration in FIG. 4 shows a cross-sectional view of SOI semiconductor structure WF in an embodiment having two different thicknesses D of semiconductor layer HLS. Only the differences from the illustration in FIG. 2 are explained below.

The thickness of semiconductor layer HLS outside the sensor region, i.e. in remaining semiconductor layer HLS, is much lower than the thickness of semiconductor layer HLS within the sensor region. The thickness of semiconductor body HLK directly outside the sensor region is reduced, so that trench structure TR is already formed in the region having a low thickness.

One advantage is that the reliability is increased and the manufacturing costs reduced by designing a trench structure with a reduced depth.

An integrated circuit IS having a plurality of CMOS transistors is formed in remaining semiconductor layer HLS, which has, for example, a thickness of 0.5 μm. The individual transistors or other components or groups of transistors or groups of components may be disposed in regions separated from each other with the aid of the trench structure.

Integrated circuit IS is connected to Hall sensor structure HSENS—which is not illustrated.

Figure 5:
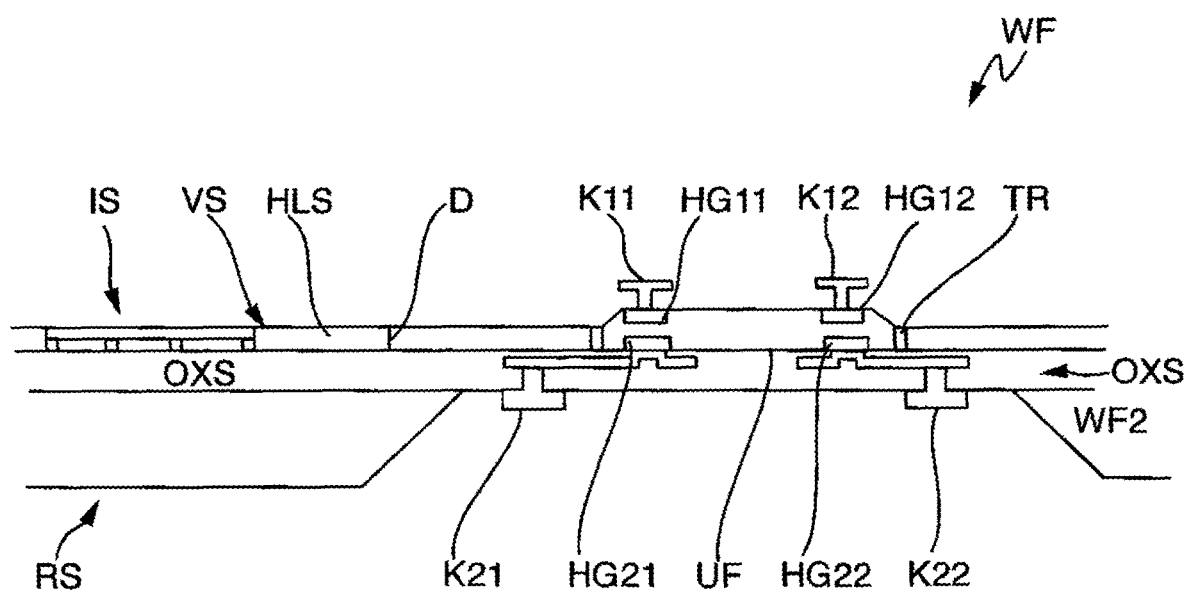
FIG. 5 shows cross-sectional view of the SOI semiconductor structure, including a connection of buried terminal contacts from the back side.

The illustration in FIG. 5 shows a cross-sectional view of SOI semiconductor structure WF, including a connection of buried terminal contacts K21, K22 and K23 from back side RS. Only the differences from the illustration in FIG. 4 are explained below.

Back side RS, except for insulating layer OXS, is etched away beneath the sensor structure. Second terminal contacts K21, K22 and K23—the latter is not illustrated—are subsequently contacted from the back side with the aid of a mask process, i.e. second terminal contacts K21, K22 and K23 are brought out in the etched-away region and may be easily electrically connected thereby.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A method for manufacturing an SOI semiconductor structure, including a three-dimensional Hall sensor structure, the method comprising:
   manufacturing, in a first process stage, at least three second highly doped semiconductor contact regions of a second conductivity type that are assigned to each of the second terminal contacts, via implantation in a plurality of process steps on a first front surface of a first semiconductor wafer, which includes a semiconductor layer having the first front surface and a first back surface;
   joining, in a second process stage, the first front surface of the first semiconductor wafer to a second front surface of a second semiconductor wafer formed as a substrate layer;
   forming an insulating layer between the first semiconductor wafer and the second semiconductor wafer after the joining, wherein, due to the joining, the first back surface of the first semiconductor wafer becomes a front side of the SOI semiconductor wafer, and the second back surface of the second semiconductor wafer becomes the back side of the SOI semiconductor wafer, and wherein the semiconductor surface of the first front surface of the first semiconductor wafer becomes a buried lower surface above the insulating layer after the joining;
   thinning, in a third process stage, a front side of the first semiconductor wafer and highly doped first semiconductor contact regions are created via implantation; and
   forming first terminal contacts on each of the first semiconductor contact regions.

2. The method for manufacturing an SOI semiconductor wafer according to claim 1, wherein a trench structure completely surrounding the sensor region is formed on the front side in a fourth process stage.

3. The method for manufacturing an SOI semiconductor wafer according to claim 1, wherein a doped polysilicon is deposited and structured during the first process stage for connecting the highly doped second semiconductor contact regions as second contact regions.

4. The method for manufacturing an Sal semiconductor wafer according to claim 1, wherein the structured polysilicon is covered with the aid of a dielectric during the first process stage.

5. The method for manufacturing an SOI semiconductor wafer according to claim 1, wherein an oxide is formed in the second process stage as an insulating layer.

6. The method for manufacturing an SOI semiconductor wafer according to claim 1, wherein the semiconductor layer is formed with two different thicknesses in the third process stage, wherein the area of the sensor region has a greater thickness than the thickness of the area of the semiconductor layer surrounding the sensor region.

7. The method for manufacturing an SOI semiconductor wafer according to claim 1, wherein a semiconductor layer having a thickness between 2 μm and 30 μm or less than 100 μm is formed in the third process stage via a CMP process.

8. The method for manufacturing an SOI semiconductor wafer according to claim 1, wherein a semiconductor layer having a uniform thickness is formed in the third process stage.

9. The method for manufacturing an SOI semiconductor wafer according to claim 1, wherein the trench etching outside the sensor region is carried out in the third process stage.

10. The method for manufacturing an SOI semiconductor wafer according to claim 1, wherein the second buried terminal contacts are connected from the front side of the semiconductor layer in another process stage.

11. The method for manufacturing an SOI semiconductor wafer according to claim 1, wherein the second terminal contacts are connected from the back side in another process stage.

12. The method for manufacturing an SOI semiconductor wafer according to claim 1, wherein the first terminal contacts and the second terminal contacts are electrically connected to the integrated circuit in a fifth process stage.

* * * * *